US011112432B2

(12) United States Patent
Hetzler et al.

(10) Patent No.: US 11,112,432 B2
(45) Date of Patent: Sep. 7, 2021

(54) MEASURING ARRANGEMENT FOR MEASURING AN ELECTRIC CURRENT IN THE HIGH-CURRENT RANGE

(71) Applicant: ISABELLENHUETTE HEUSLER GMBH & CO. KG, Dillenburg (DE)

(72) Inventors: Ullrich Hetzler, Dillenburg-Oberscheld (DE); Michael Pollmann, Dillenburg (DE)

(73) Assignee: ISABELLENHUETTE HEUSLER GMBH & CO. KG, Dillenburg (DE)

( * ) Notice: Subject to any disclaimer, the term of this patent is extended or adjusted under 35 U.S.C. 154(b) by 120 days.

(21) Appl. No.: 16/326,028

(22) PCT Filed: Aug. 1, 2017

(86) PCT No.: PCT/EP2017/069443
§ 371 (c)(1),
(2) Date: Feb. 15, 2019

(87) PCT Pub. No.: WO2018/033380
PCT Pub. Date: Feb. 22, 2018

(65) Prior Publication Data
US 2019/0170791 A1    Jun. 6, 2019

(30) Foreign Application Priority Data
Aug. 17, 2016 (DE) .......................... 102016010012.5

(51) Int. Cl.
*G01R 1/20* (2006.01)
(52) U.S. Cl.
CPC .................................... *G01R 1/203* (2013.01)
(58) Field of Classification Search
CPC ..................................................... G01R 1/203
See application file for complete search history.

(56) References Cited

U.S. PATENT DOCUMENTS

| 3,245,021 A | 4/1966 | Kernander et al. |
| 2003/0222511 A1 | 12/2003 | Hetzler |

(Continued)

FOREIGN PATENT DOCUMENTS

| CN | 102473492 A | 5/2012 |
| CN | 103427650 A | 12/2013 |

(Continued)

OTHER PUBLICATIONS

International Search Report for corresponding PCT Application No. PCT/EP2017/069443 dated Sep. 15, 2017.

(Continued)

*Primary Examiner* — Clayton E. LaBalle
*Assistant Examiner* — Michael A Harrison
(74) *Attorney, Agent, or Firm* — Caesar Rivise, PC (57) ABSTRACT

The invention relates to a measuring arrangement (12) for measuring an electric current (I) in the high-current range, in particular in the current range of more than 1 kA, having a low-resistance current sense resistor (1) for measuring current in accordance with four conductor technology and a physically integrated measuring circuit (17) for measuring the voltage which is dropped across the current sense resistor (1). The invention provides several pairs of voltage taps for measuring the electrical voltage which is dropped across the resistor element (4), wherein the pairs of voltage taps are connected to the measuring circuit (17). The invention further provides two busbar connections (13, 14) for connection to two busbars (15, 16). Corrections of the temperature coefficient, the thermoelectric voltage and the offset and also a high sampling rate and resolution allow high-resolution measurement of a DC current in a high AC current.

42 Claims, 3 Drawing Sheets

(56) References Cited

U.S. PATENT DOCUMENTS

| | | | |
|---|---|---|---|
| 2007/0177318 A1 | 8/2007 | Oman et al. | |
| 2008/0030208 A1* | 2/2008 | Aratani | H01M 10/48 324/713 |
| 2011/0050260 A1* | 3/2011 | Teramoto | G01R 31/364 324/705 |
| 2012/0154104 A1 | 6/2012 | Hetzler | |
| 2014/0191772 A1* | 7/2014 | Hetzler | G01R 19/2506 324/705 |
| 2016/0003874 A1 | 1/2016 | Marien | |
| 2016/0041206 A1 | 2/2016 | Hetzler | |
| 2016/0077135 A1 | 3/2016 | Joeckel et al. | |
| 2017/0212148 A1 | 7/2017 | Hetzler | |

FOREIGN PATENT DOCUMENTS

| | | |
|---|---|---|
| CN | 104520944 A | 4/2015 |
| DE | 614602 | 6/1935 |
| DE | 2939594 | 4/1981 |
| DE | 202009010319 | 11/2009 |
| DE | 102013005939 | 10/2014 |
| DE | 102014207756 | 10/2015 |
| DE | 102014218708 | 3/2016 |
| DE | 102016008415 | 1/2018 |
| EP | 0605800 | 7/1994 |
| EP | 1363131 | 11/2003 |
| FR | 1454129 | 7/1966 |
| FR | 2884615 A1 | 10/2006 |
| GB | 2056182 B | 3/1981 |
| WO | WO2013037677 | 3/2013 |
| WO | WO2014127788 | 8/2014 |
| WO | WO2014161624 | 10/2014 |
| WO | WO2016015842 | 2/2016 |
| WO | WO2018010996 | 7/2017 |

OTHER PUBLICATIONS

English Abstract of FR2884615A1.
English Abstract of CN103427650A.
English Abstract of CN104520944A.
English Abstract of CN102473492A.
Office Action for related Chinese Application No. 201780050263.5 dated Oct. 26, 2020.

* cited by examiner

MEASURING ARRANGEMENT FOR MEASURING AN ELECTRIC CURRENT IN THE HIGH-CURRENT RANGE

CROSS REFERENCE TO RELATED APPLICATIONS

This application is the U.S. National Phase Application of PCT/EP2017/069443, filed Aug. 1, 2017, the contents of which is incorporated herein by reference in its entirety for all purposes.

The invention concerns a measuring arrangement for measuring an electrical current in the high-current range, in particular in the current range of more than 1 kA.

For example, it is known from EP 0 605 800 A1 that electric currents are measured using a low-impedance current sense resistor ("shunt") in accordance with the four-wire technology. Here, the electrical current to be measured flows through the low-resistance current sense resistor, whereby the voltage drop across the measuring resistor is measured and then forms a measure of the electrical current in accordance with Ohm's law.

It is also known from WO 2014/127788 A1 that the four-wire technology can also be used for current measurement in medium-voltage and high-voltage systems. However, this publication does not yet offer a satisfactory solution for the design of the resistor and for the electrical connection of the current sense resistor to the medium-voltage system or the high-voltage system.

Furthermore, US 2007/0177318 A1 provides a current sense resistor which enables current measurement according to the four-wire technology. However, this well-known current sense resistor is designed for mounting on a printed circuit board and is therefore not suitable for current measurement in a medium-voltage or high-voltage system. However, this well-known current sense resistor already has a measuring circuit to measure the voltage drop across the resistor element of the current sense resistor, whereby the measuring circuit can be plugged onto the top of the current sense resistor and then connected to the current sense resistor by a snap-in connection. The lack of suitability for high-current measurement in a medium-voltage or high-voltage system is also due to the fact that the measuring circuit is not structurally integrated and therefore not shielded. During a high-current measurement in a medium voltage system or high voltage system, the electronic components of the measuring circuit can therefore be disturbed.

Furthermore, with regard to the general technical background of the invention, reference should also be made to U.S. Pat. No. 6,801,118 B1, WO 2013/037677 A1 and U.S. Pat. No. 3,245,021 A.

The invention is therefore based on the task of creating a correspondingly improved measuring arrangement.

This task is solved by a measuring arrangement according to the main claim.

The measuring arrangement according to the invention first comprises a low impedance current sense resistor in accordance with the state of the art in order to measure an electrical current according to the known four-wire technology. The current sense resistor essentially consists of a first connecting part made of a conductor material (e.g. copper) for introducing the electrical current to be measured into the current sense resistor, a second connecting part made of a conductor material (e.g. copper) for diverting the electrical current to be measured from the current sense resistor and a resistor element made of a resistor material (e.g. Manganin®), the resistor element being electrically connected between the two connecting parts and through which the electrical current to be measured flows. Such low-resistance current sense resistors are generally known from EP 0 605 800 A1, but their resistance value, dimensions and shape must be adapted to the size of the electrical current to be measured and to the customer's requirements.

In addition, the invention-based measuring arrangement includes a structurally integrated measuring circuit which measures the electrical voltage dropping across the resistance element. For example, this measuring circuit can be designed as an application-specific integrated circuit (ASIC). Such ASICs are known from EP 1 363 131 A1, for example, so that the contents of this publication is fully attributable to the present description with regard to the structure and functionality of the measurement circuit. However, it should be mentioned that the integrated measuring circuit preferably has a 16-bit measured value acquisition.

The invention-based measuring arrangement is characterized in that the electrical voltage falling across the resistance element of the current sense resistor is not measured by a single pair of voltage taps, but by several pairs of voltage taps, the pairs of voltage taps being connected to the measuring circuit. This is advantageous because the current density in the resistor element of the low-resistance current sense resistor is not spatially constant. As a result, the measured value of the voltage dropping across the resistor element depends on the spatial positioning of the voltage taps, which leads to a measurement error. With the measuring arrangement according to the invention with several spatially distributed pairs of voltage taps, on the other hand, it is possible for the measuring circuit to evaluate several voltage measured values which are measured on the different pairs of voltage taps. An average value can then be calculated from these different voltage measurement values, for example, which minimizes the measurement error. Details on this are known from WO 2014/161624 A1, so that the contents of this publication is fully attributable to this description.

In addition, the measuring arrangement according to the invention is characterised by two busbar connections in order to be able to connect the measuring arrangement with busbars. The first busbar connection (preferably for contacting with three busbars arranged one above the other) is electrically connected to the first connecting part of the low-impedance measuring resistor, while the second busbar connection is electrically connected to the second connecting part of the non-resistive measuring resistor. The measuring arrangement according to the invention therefore allows a simple and reliable electrical connection with busbars in a high-current arrangement.

In a preferred embodiment of the invention, the two busbar connections each have several parallel connection plates made of a conductor material, one above the other. This enables contact to be made with three busbars arranged one above the other and offers the advantage that the electrical current to be measured is divided and flows through the various connection plates, whereby the current density remains in a relatively low range even during high-current measurement and does not exceed the current carrying capacity of the busbar connections.

It should also be mentioned that the two busbar connections are preferably designed for screw mounting to the busbars. For this purpose, the busbar connections may, for example, have holes for a screw connection.

It should also be mentioned that the busbar connections are preferably nickel-plated, tin-plated, silver-plated or gold-plated in order to improve resistance to environmental influences.

In the preferred embodiment of the invention, the measuring arrangement has several low-resistance current sense resistors which are connected electrically in parallel so that the current to be measured is divided into several partial currents which flow through the individual current sense resistors. The current sense resistors can be arranged on top of each other in several planes. In addition, several current sense resistors can be arranged next to each other in each plane. When manufacturing the low-resistance current sense resistor from a composite material strip according to EP 0 605 800 A1, this subdivision into several current sense resistors can be achieved by inserting several slots in the strip of resistance material which run lengthwise to the current flow direction and are arranged next to each other transversely to the current flow direction. The slots then separate several adjacent resistor elements from each other in the composite material strip and the resulting current sense resistor.

A special feature is the integration of the complete measurement and evaluation electronics in the shunt in close proximity to the voltage taps. The connection between the voltage tap and the measuring transformer (e.g. ASICs) is preferably made using flexible lines in stripline technology. Both measures (short lines and stripline technology) lead to a very interference-free measuring arrangement (extremely small antenna area).

It should also be mentioned that with the installation in the shunt, the electronic components (e.g. measuring circuit, data interface) of the measuring arrangement according to the invention are encapsulated within an electrical shield made of a conductor material. This makes sense, since otherwise a disturbance of the electronic components by the electrical current to be measured would be possible with a high-current measurement. The electrical shielding is formed by the busbar connections, spacers between the busbar connections and lateral, one-sided electrically insulated reinforcement plates made of a conductor material. Additional shielding plates made of ferromagnetic materials are mounted on the top and underside, electrically insulated on one side.

Preferably, the measuring arrangement also includes a structurally integrated data interface for sending data to an evaluation unit provided by the customer and/or for receiving data from outside. The data interface preferably also forms a galvanic separation, since the measuring arrangement on one side and the evaluation unit on the other side usually lie on different electrical potentials. This galvanic isolation can be realized, for example, by an optocoupler together with an optical fibre. Details for the technical implementation of such a data interface are known from WO 2014/127788 A1, for example, so that the contents of this publication can be fully attributed to the present description.

It should also be mentioned that the resistance material of the resistor element in the low-resistance current sense resistor has an extremely low temperature dependence of its resistance value, but this can nevertheless not be neglected if a very precise measurement is sought. To compensate for this temperature dependence, the measuring arrangement may have one or more temperature sensors which measure the temperature of the resistor element of the low-resistance current sense resistor and correct the measured value of the electrical voltage falling across the resistor element according to a temperature-dependent correction characteristic.

It should also be noted that the resistor material of the resistor element of the low-resistance current sense resistor has a specific thermal force which, if there is a temperature difference between the resistor element on the one hand and the connecting parts on the other, generates a specific thermoelectric voltage. This thermoelectric voltage is superimposed on the voltage generated by the electrical current to be measured in the resistor element and therefore leads to a measurement error. In the preferred embodiment of the invention, therefore, a compensating element is provided to compensate for the thermoelectric voltage falling across the resistor element, which is thermally connected to the two connecting parts and is thus exposed to the same temperature differences as the resistor element. If there is a temperature difference between the compensating element on the one hand and the connecting parts on the other, the compensating element generates a certain thermoelectric voltage. The compensating element and the resistor element are electrically connected in series in a voltage measuring circuit so that the thermoelectric voltage of the resistor element on the one hand and the compensating element on the other compensates each other at least partially. The details of this thermoelectric voltage compensation are described in the German patent application 10 2016 008 415.4, so that the content of this patent application is fully attributable to the present description. In addition to this compensating element, the temperature difference is preferably measured at each voltage measuring point, so that in the event of incomplete compensation of the thermoelectric voltage, a mathematical correction can also be made.

It has already been mentioned above that the measuring arrangement has voltage taps for tapping the electrical voltage falling across the current sense resistor. These voltage taps can be advantageously integrated into a ribbon cable which is electrically contacted over the entire surface of the current resistor. This ribbon cable is preferably multi-layered and forms a stripline, whereby the temperature sensor and the temperature difference sensor mentioned above can also be attached to the ribbon cable. In addition, the compensating element mentioned above, which serves to compensate the thermoelectric voltage, can also be attached to the ribbon cable.

Direct soldering of the ribbon cable to the low-impedance current sense resistor is generally not possible due to the extremely good heat dissipation of the copper and the limited temperature resistance of the ribbon cable. Between the ribbon cable and the current sense resistor there is therefore preferably a plate made of a conductor material (e.g. copper), whereby this plate is connected to the current sense resistor by soldering, sintering, welding or conductive adhesive bonding (i.e. producing an electrically conductive adhesive connection). For electrical contacting of the ribbon cable, this plate has connection pins which can be bent up, after which the connection pins of the plate can be connected (soldered, welded or glued with conductive adhesive) to the corresponding electrical connection points of the ribbon cable. The plate between the ribbon cable and the current sense resistor thus facilitates the connection between the ribbon cable and the current sense resistor.

In a variant of the invention, the measuring arrangement for the power supply of the electronic components comprises a high-voltage transformer.

In another variant of the invention, on the other hand, a photovoltaic cell is provided for the power supply, which is irradiated by a light source (e.g. laser or LED) to generate electricity via a light guide. Details of this type of power generation are known from WO 2014/127788 A1, for example, so that the contents of this publication is fully attributable to this description.

In a preferred embodiment of the invention, the current sense resistor has several flat composite plates, such as those known from EP 0 605 800 A1, these composite plates comprising the resistor element and the connecting parts. The composite plates are preferably arranged parallel to each other on top of each other. The adjacent composite material plates are electrically and mechanically connected to each other at the connecting parts, while the adjacent composite material plates are electrically separated from each other in the area of the resistor elements by an insulating gap. The electrical current to be measured is divided and flows separately through the adjacent resistor elements of the superimposed composite material plates.

However, current distribution can not only take place in the vertical direction, but also in the horizontal direction, i.e. within a composite plate. For this purpose, the composite plates may each have a number of slots which are arranged alongside each other along the direction of current flow and transverse to the direction of current flow, the slots in each composite plate separating a number of resistor elements from each other.

The current sense resistor, for example, can have a resistance value in the range of 1 µΩ-1 mΩ.

For example, the resistor material of the current sense resistor may be a copper-manganese-nickel alloy such as Cu86Mn12Ni2. Alternatively, the resistance material may be a copper-manganese-tin alloy, such as Cu90.7Mn7Sn2.3, or a nickel-chromium alloy, particularly a nickel-chromiumaluminium alloy, such as Ni74.5Cr20Al13.5Si1Mn0.5Fe0.5.

The conductor material is preferably copper or a copper alloy. It should be noted that the conductor material preferably has a lower resistivity than the resistor material of the resistor element.

It should also be mentioned that the measuring arrangement can preferably be loaded with a high-current. For example, the short-term maximum current can be at least 10 kA, 25 kA, 50 kA, 100 kA, 200 kA or even 500 kA. The continuous current carrying capacity, on the other hand, is preferably at least 1 kA, 2 kA, 5 kA, 10 kA, 20 kA or even at least 30 kA.

In addition, it should be mentioned that the resistor element preferably has a relatively short length in the direction of current flow, preferably less than 50 mm, 25 mm, 10 mm, 7 mm or even 5 mm.

It should also be mentioned that the measuring arrangement preferably has a very low linearity error which is preferably less than 0.1%, 0.05%, 0.01% or even 0.005%.

The measuring circuit is preferably offset-free and has a sampling rate of preferably more than 500 Hz, 1 kHz, 2 kHz or 4 kHz.

A particularly advantageous and for the application essential characteristic of the measuring arrangement is the possibility to measure very small DC currents (DC: Direct current) of some 100 mA to a few Ampere in a high AC current (AC: Alternating current) of e.g. 20 kA. This is made possible by the high resolution of the transducers, their offset-freedom, the high linearity and the extremely low noise. In addition, the absolutely synchronous sampling of the individual measuring channels (8 channels in the described system) is of decisive importance. This synchronous measurement reduces the noise of the average value again by approx. 70%.

With regard to the shape of the current sense resistor, it should be mentioned that the resistor element and/or the connecting parts are preferably plate-shaped, as is known from EP 0 605 800 A1, for example, whereby the resistor element and the connecting parts can be either flat or curved.

In addition, the current sense resistor preferably has a low internal thermal resistance which is preferably less than 1 K/W, 0.5 K/W, 0.1 K/W, 0.05 K/W or 0.02 K/W.

It should also be mentioned that the measuring circuit preferably has several measuring channels, namely a first measuring channel for continuous current detection and a separate second measuring channel with a higher sampling rate for overcurrent detection.

Other advantageous further modifications of the invention are indicated in the dependent claims or are explained in more detail below together with the description of the preferred embodiments of the invention by means of the figures. They show:

Figure 1A:
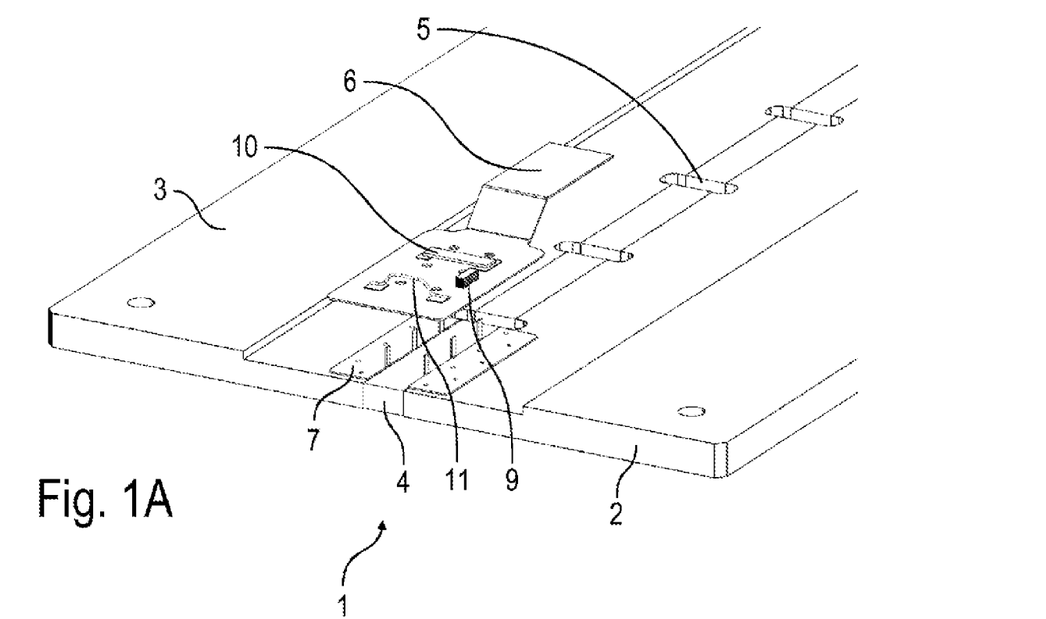
FIG. 1A a perspective view of a part of the measuring arrangement with a copper plate and a flexible cable, FIG. 1B an enlarged view of FIG. 1A, FIG. 2 a block diagram to illustrate the structure and function of the measuring arrangement according to the invention, FIG. 3A a cross-sectional view through a measuring arrangement according to the invention, and FIG. 3B a current sense resistor of the measuring arrangement according to FIG. 3A in cross-section.
Figure 1B:
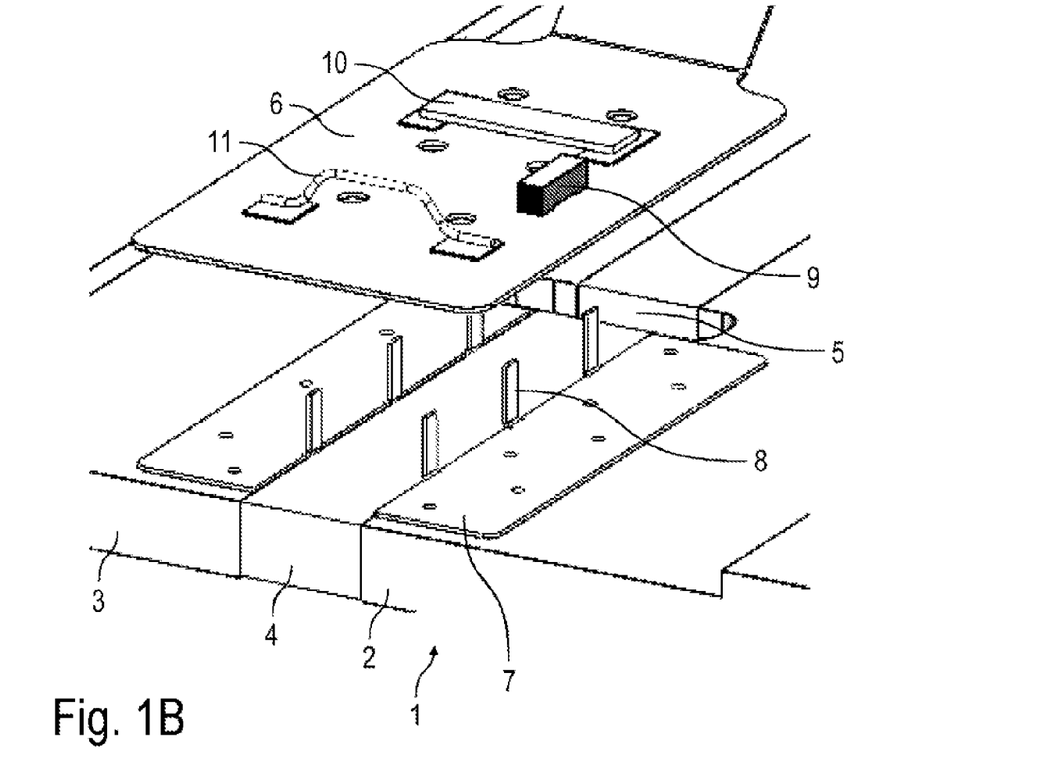

FIGS. 1A and 1B show different views of a partial area of the measuring arrangement with one of four low impedance current sense resistors 1 for current measurement according to the well-known four-wire technique, whereby the current sense resistor 1 is adapted for current measurement in the high-current range of, for example, more than 1 kA.

The current sense resistor 1 firstly has a first connecting part 2 in order to feed the electrical current to be measured into the current resistor 1.

In addition, the current sense resistor 1 has a second connecting part 3 in order to lead the electrical current to be measured out of the current sense resistor 1 again.

A resistor element 4 made of a resistor material such as Manganin®, Zeranin® or Isaohm® is arranged between the two connecting parts 2, 3. The resistor element 4 is electrically and mechanically connected along its longitudinal edges to the adjacent connecting parts 2, 3 by a welded joint.

In the current sense resistor 1 there are several slots 5 which run along the direction of current flow and are arranged next to each other, so that the slots 5 electrically separate several resistor elements 4 in the current sense resistor 1 from each other. The electrical current to be measured is thus divided within the current sense resistor 1 and then flows in parallel through the adjacent resistor elements 4, which are separated from each other by the slots 5.

Flat ribbon cables 6 are arranged on the upper side of the current sense resistor 1 (only one measuring point is shown as an embodiment), which are also used to measure the electrical voltage falling across the resistor element 4. However, direct soldering of the ribbon cable 6 to the current sense resistor 1 is not possible because the current sense resistor 1 is connected to the busbar connections in the measuring arrangement and therefore has a very high thermal conductivity and because the temperature resistance of the ribbon cable 6 is limited. A copper plate 7 is therefore arranged between each of the flat ribbon cables 6 and the current sense resistor 1, which is first contacted (e.g. soldered) with the current sense resistor 1 and forms voltage taps in order to measure the electrical voltage falling across the resistor element 4. The copper plate 7 is fitted with connection pins 8, which are bent upwards as shown in the drawings. The ribbon cable 6 can then simply be soldered to the connection pins 8.

On the ribbon cable 6 there is a temperature sensor 9 which has the task to measure the temperature of the resistor element 4 in order to compensate measuring errors caused by the temperature dependence of the resistance material of the resistor element 4.

In addition, a compensating element 10 in the form of a composite material plate is arranged on the ribbon cable 6 to compensate for thermoelectric voltages. The details of this thermoelectric voltage compensation are described in the German patent application 10 2016 008 415.4.

Furthermore and optionally, a thermocouple 11 for measuring the temperature difference can also be arranged on the ribbon cable 6 in order to compensate thermoelectric voltages mathematically.

In addition to the current sense resistor 1, it should also be mentioned that the current sense resistor 1 is connected to busbar connections in the assembled state, as described in detail below.

Figure 2:
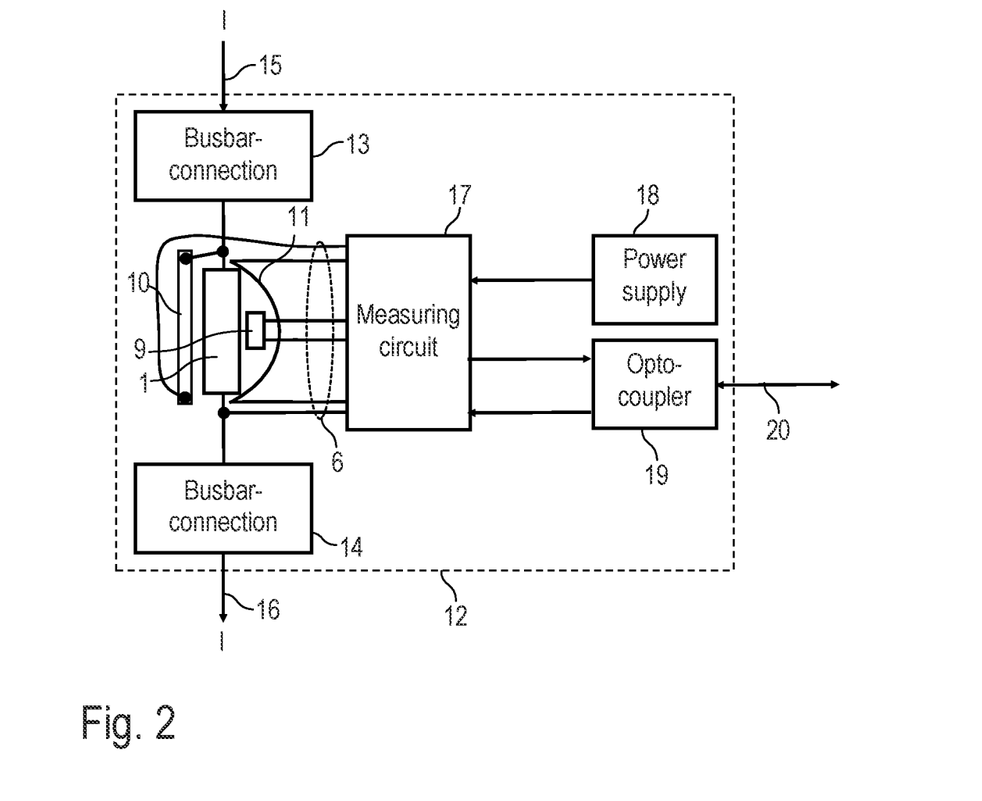

FIG. 2 shows a circuit diagram of a measuring arrangement 12 according to the invention with the current sense resistor 1. In this diagram, busbar connections 13, 14 are also schematically shown, which serve to connect the measuring arrangement 12 to busbars 15, 16, whereby the busbars 15, 16 are only schematically shown.

The circuit diagram also shows a measuring circuit 17, which measures the electrical voltage falling above the current sense resistor 1 in order to calculate the electrical current from it in accordance with Ohm's law.

In addition, the measuring circuit 17 is connected to the temperature sensor 9, the compensating element 10 and the thermocouple 11. The connection with the temperature sensor 9 allows the compensation of the temperature dependence of the resistor material's specific electrical resistance of the resistor element 4. The connection with the compensating element 10, on the other hand, allows the compensation of thermoelectric voltages. For this purpose, the compensating element 10 is connected in series with the current sense resistor 1 in the voltage measuring circuit, so that the thermoelectric voltages above the current sense resistor 1 on the one hand and above the compensating element 10 on the other hand are at least partially balanced. The thermocouple 11 is optional and allows a mathematical correction of the thermoelectric voltage by measuring the temperature difference.

In addition, the diagram shows a power supply 18 that can be implemented as a high-voltage transformer or with a photocell, as described in WO 2014/127788 A1, for example.

In addition, the measuring arrangement 12 has a data interface 19 with an optocoupler so that data can be transmitted via an optical fibre 20 to an external evaluation unit, whereby the optocoupler and optical fibre form an effective galvanic separation.

Figure 3A:
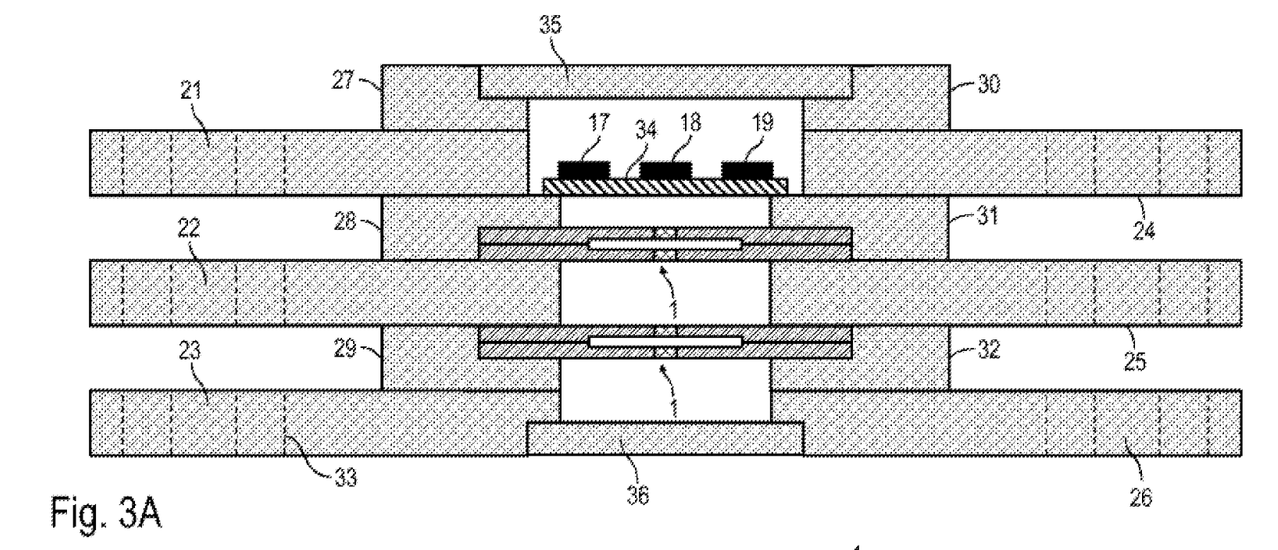
Figure 3B:
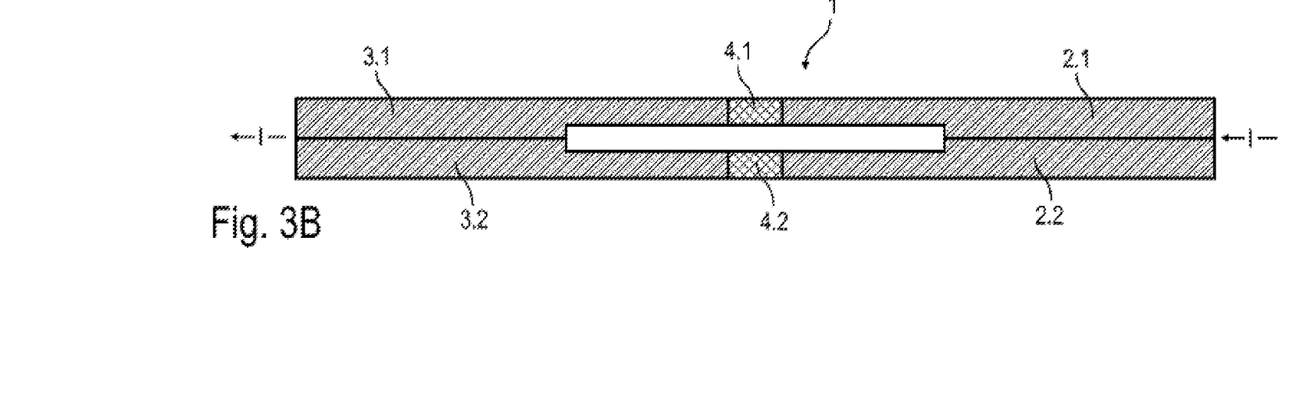

FIGS. 3A and 3B show a cross-sectional view of a measuring arrangement 12 that partly corresponds to the above embodiment, so that the above description is referred to in order to avoid repetition, using the same reference signs for corresponding details.

It should be noted here that this measuring arrangement 12 has several connection plates 21-26 made of one conductor material (e.g. copper), whereby the connection plates 21-26 are arranged one above the other in three parallel planes. Between the connection plates 21-26 or on the upper side of the connection plates 21, 24 there are several spacers 27-32 which also consist of a conductor material (e.g. copper).

The connection plates 21-26 are part of the busbar connections 13, 14 and are designed for screw mounting. The connection plates 21-26 each have through-holes 33 for this purpose.

The measuring arrangement 12 has two current sense resistors 1 (each consisting of two individual resistors), which are shown in detail in FIG. 3B.

The current sense resistor 1 has two connecting parts 2.1, 2.2 for the introduction of the electrical current and two connecting parts 3.1, 3.2 for the diversion of the electrical current, each of which is connected to the other. In between are two resistor elements 4.1, 4.2 made of a resistor material. The electrical current to be measured is thus divided within the current sense resistor 1 and flows separately through the two resistor elements 4.1, 4.2.

The measuring arrangement 12 also contains a printed circuit board 34 with the measuring circuit 17, the power supply 18 and the data interface 19.

The printed circuit board 34 is connected via the ribbon cable 6 to the two current sense resistors 1, whereby the ribbon cable 6 is not shown in FIGS. 3A and 3B.

On the upper side, the measuring arrangement 12 is closed by a cover 35, while on the lower side a base 36 closes the measuring arrangement 12. The cover 35 and the base 36 are made of an electrically insulating material or have at least one electrically insulating sheath to prevent an undesirable short circuit across the cover 35 or the base 36. The cover 35 and the base 26 contain an electrically conductive, preferably ferromagnetic shielding material which is insulated at least on one side from the measuring arrangement.

A mechanical reinforcement plate is applied to the front and rear sides in FIG. 3 (i.e. in front of and behind the drawing plane), which are insulated on one side from the measuring arrangement and screwed to the copper connection plates 21-26. These reinforcement plates are not shown in FIG. 3.

The invention is not limited to the preferred embodiments described above. Rather, a large number of variants and modifications are possible which also make use of the invention idea and therefore fall within the scope of protection. In particular, the invention also claims protection for the subject-matter and the features of the dependent claims independently of the claims referred to in each case and in particular also without the features of the main claim. For example, the invention also includes variants according to the invention without the characterizing features of the main claim.

LIST OF REFERENCE SIGNS

1 Current sense resistor as part of the measuring arrangement
2, 2.1, 2.2 Connecting part for conducting the current
3, 3.1, 3.2 Connecting part for current diversion
4, 4.1, 4.2 Resistor element
5 Slots to separate the resistor elements
6 Ribbon cable
7 Copper plate
8 Connection pins of the copper plate
9 Temperature sensor
10 Compensating element as a composite material plate
11 Thermocouple
12 Measuring arrangement for current measurement
13 Busbar connection 14 Busbar connection
15, 16 External busbars
17 Measuring circuit
18 Power supply
19 Data interface with optocoupler
20 Light guides
21-26 Copper connection plates
27-32 Copper spacers
33 Holes in the connection plates for screw mounting
34 Printed circuit board
35 Cover for electrical shielding
36 Base for electrical shielding
I Current

The invention claimed is:

1. Measuring arrangement for measuring an electric current in a high-current range, comprising:
   a) a low-resistance current sense resistor for current measurement in accordance with the four-wire technology, with
      a1) a first connecting part made of a conductor material for introducing the electric current to be measured into the current sense resistor,
      a2) a second connecting part made of a conductor material for conducting the electric current to be measured out of the current-measuring resistor, and
      a3) a resistor element made of a resistance material, the resistor element being electrically connected between the first terminal part and the second terminal part and the current to be measured flowing through it,
   b) a structurally integrated measuring circuit, the measuring circuit measuring the electrical voltage which drops across the resistor element,
   c) a plurality of pairs of voltage taps for measuring the electric voltage falling across the resistor element, the pairs of voltage taps being connected to the measuring circuit,
   d) a first busbar connection made of a conductive material for electrical and mechanical connection to a first busbar, the first busbar connection being electrically connected to the first connecting part of the current sense resistor, and
   e) a second busbar connection made of a conductor material for electrical and mechanical connection to a second busbar, the second busbar connection being electrically connected to the second connecting part of the current sense resistor, wherein the measuring arrangement has a plurality of low-resistance current sense resistors which are connected electrically in parallel, so that the current to be measured is divided into a plurality of partial currents which flow through the individual current sense resistors.

2. Measuring arrangement according to claim 1, wherein the first busbar connection and the second busbar connection are designed for screw mounting.

3. Measuring arrangement according to claim 1, wherein the first busbar connection and the second busbar connection are at least partially nickel-plated.

4. Measuring arrangement according to claim 1, wherein the current sense resistors are arranged one above the other in a plurality of planes.

5. Measuring arrangement according to claim 4, wherein in each of the planes in each case a plurality of current sense resistors are arranged next to one another.

6. Measuring arrangement according to claim 1, wherein the measuring arrangement has a structurally integrated data interface for transmitting and/or receiving data.

7. Measuring arrangement according to claim 6, wherein the data interface has an optocoupler.

8. Measuring arrangement according to claim 7, wherein an optical fibre is connected to the optocoupler.

9. Measuring arrangement according to claim 8, wherein the data interface together with the optical fibre forms an electrical isolation.

10. Measuring arrangement according to claim 6, wherein at least one of the measuring circuit and the data interface are encapsulated in an electrical shielding made of a conductor material.

11. Measuring arrangement according to claim 1, wherein at least one of the measuring circuit and the data interface are encapsulated in an electrical shielding made of a conductor material.

12. Measuring arrangement according to claim 11, wherein the electrical shielding is formed at least partially from the busbar connections and spacers made of a conductor material between the busbar connections and from lateral reinforcing plates made of a conductor material.

13. Measuring arrangement according to claim 1, wherein the pairs of voltage taps are arranged next to one another transversely to the direction of current flow.

14. Measuring arrangement according to claim 1, wherein the measuring circuit measures the voltages falling at the pairs of voltage taps synchronously at a high sampling rate of at least 4 kHz.

15. Measuring arrangement according to claim 1, wherein the measuring circuit calculates an average value from the voltages measured at the pairs of voltage taps.

16. Measuring arrangement according to claim 1, wherein the measuring circuit calculates a direct current from the voltages measured at the pairs of voltage taps and the values for the temperature and temperature difference.

17. Measuring arrangement according to claim 1, wherein
    a) voltage taps are provided for sensing the electrical voltage falling across the current sense resistor, and
    b) the voltage taps are integrated into a flat ribbon cable.

18. Measuring arrangement according to claim 17, wherein the flat ribbon cable is soldered onto the current sense resistor.

19. Measuring arrangement according to claim 17, wherein the ribbon cable is multi-layered.

20. Measuring arrangement according to claim 17, wherein the flat ribbon cable forms a strip conductor.

21. Measuring arrangement according to claim 17, wherein the temperature sensor is mounted on the ribbon cable.

22. Measuring arrangement according to claim 17, wherein the compensating element which serves to compensate the thermoelectric voltage is mounted on the flat ribbon cable.

23. Measuring arrangement according to claim 17, wherein the thermal element used for temperature difference measurement is mounted on the flat ribbon cable.

24. Measuring arrangement according to claim 17, wherein
    a) a plate made of a conductor material is arranged between the flat ribbon cable and the current sense resistor,
    b) the plate is connected to the current sense resistor by soldering, sintering, welding or conductive adhesive bonding,
    c) the plate has connecting pins for making electrical contact with the flat ribbon cable, and
    d) the connecting pins of the plate are connected to electrical connection points of the flat ribbon cable.

25. Measuring arrangement according to claim 1, wherein
a) the current sense resistor has a plurality of planar composite material plates which each comprise the resistor element and the connecting parts,
b) the composite material plates are arranged parallel to each other,
c) the adjacent composite material plates are electrically and mechanically connected to each other at the connecting parts,
d) the adjacent composite material plates in the region of the resistor element are electrically separated from one another by an insulating gap, and
e) the composite material plates each have a plurality of slots which run longitudinally to the direction of current flow and are arranged next to one another transversely to the direction of current flow and, in the composite material plates, each separate a plurality of resistor elements from one another.

26. Measuring arrangement according to claim 1, wherein
a) the current sense resistor has a resistance value of not more than 1 mΩ,
b) the resistance material of the current sense resistor is one of the following materials:
b1) a copper-manganese-nickel alloy,
b2) a copper-manganese-tin alloy, and
b3) a nickel-chromium alloy,
c) the conductor material is copper or a copper alloy, and
d) the conductor material has a lower resistivity than the resistor material.

27. Measuring arrangement according to claim 1, wherein
a) the measuring arrangement can be pulse-loaded with a short-term maximum current of at least 10 kA with a pulse duration of 100 ms, and
b) the measuring arrangement can be loaded with a continuous current of at least 1 kA.

28. Measuring arrangement according to claim 1, wherein the resistor element has a length in the direction of current flow not exceeding 50 mm.

29. Measuring arrangement according to claim 6, wherein the measuring circuit and the data interface are arranged within an electrical shielding.

30. Measuring arrangement according to claim 1, wherein the measuring circuit and the data interface are arranged within an electrical shielding.

31. Measuring arrangement according to claim 1, wherein
a) the measuring arrangement has a linearity error of less than 0.1%,
b) the measuring circuit is offset-free, and
c) the measuring circuit has a sampling rate of at least 500 Hz.

32. Measuring arrangement according to claim 1, wherein
a) the resistor element of the current sense resistor is plate-shaped, and
b) the first connecting part and the second connecting part of the current sense resistor is plate-shaped.

33. Measuring arrangement according to claim 1, wherein the measuring arrangement has a low internal thermal resistance of less than 1 K/W.

34. Measuring arrangement according to claim 1, wherein the resistor element is connected to the first connecting part and to the second connecting part by a welded joint.

35. Measuring arrangement according to claim 1, wherein the current sense resistor has a plurality of slots which run longitudinally to the current flow direction and are arranged next to one another transversely to the current flow direction and separate a plurality of resistor elements from one another so that the electric current to be measured is divided and flows through the individual resistor elements.

36. Measuring arrangement for measuring an electric current in a high-current range, comprising:
a) a low-resistance current sense resistor for current measurement in accordance with the four-wire technology, with
a1) a first connecting part made of a conductor material for introducing the electric current to be measured into the current sense resistor,
a2) a second connecting part made of a conductor material for conducting the electric current to be measured out of the current-measuring resistor, and
a3) a resistor element made of a resistance material, the resistor element being electrically connected between the first terminal part and the second terminal part and the current to be measured flowing through it,
b) a structurally integrated measuring circuit, the measuring circuit measuring the electrical voltage which drops across the resistor element,
c) a plurality of pairs of voltage taps for measuring the electric voltage falling across the resistor element, the pairs of voltage taps being connected to the measuring circuit,
d) a first busbar connection made of a conductive material for electrical and mechanical connection to a first busbar, the first busbar connection being electrically connected to the first connecting part of the current sense resistor, and
e) a second busbar connection made of a conductor material for electrical and mechanical connection to a second busbar, the second busbar connection being electrically connected to the second connecting part of the current sense resistor, wherein
f) the first busbar connection has a plurality of parallel connecting plates which are arranged one above the other and consist of a conductor material, and
g) the second busbar connection has a plurality of parallel connecting plates which are arranged one above the other and are made of a conductor material.

37. Measuring arrangement for measuring an electric current in a high-current range, comprising:
a) a low-resistance current sense resistor for current measurement in accordance with the four-wire technology, with
a1) a first connecting part made of a conductor material for introducing the electric current to be measured into the current sense resistor,
a2) a second connecting part made of a conductor material for conducting the electric current to be measured out of the current-measuring resistor, and
a3) a resistor element made of a resistance material, the resistor element being electrically connected between the first terminal part and the second terminal part and the current to be measured flowing through it,
b) a structurally integrated measuring circuit, the measuring circuit measuring the electrical voltage which drops across the resistor element,
c) a plurality of pairs of voltage taps for measuring the electric voltage falling across the resistor element, the pairs of voltage taps being connected to the measuring circuit,
d) a first busbar connection made of a conductive material for electrical and mechanical connection to a first busbar, the first busbar connection being electrically connected to the first connecting part of the current sense resistor, and e) a second busbar connection made of a conductor material for electrical and mechanical connection to a second busbar, the second busbar connection being electrically connected to the second connecting part of the current sense resistor, wherein f) at least one temperature sensor is provided for temperature measurement at the current sense resistor, g) the measuring circuit is connected to the temperature sensor, h) the current sense resistor has a temperature-dependent resistance value, and i) the measuring circuit compensates the temperature dependence of the resistance value in accordance with the temperature measured by the temperature sensor.

38. Measuring arrangement for measuring an electric current in a high-current range, comprising:

a) a low-resistance current sense resistor for current measurement in accordance with the four-wire technology, with
  a1) a first connecting part made of a conductor material for introducing the electric current to be measured into the current sense resistor,
  a2) a second connecting part made of a conductor material for conducting the electric current to be measured out of the current-measuring resistor, and
  a3) a resistor element made of a resistance material, the resistor element being electrically connected between the first terminal part and the second terminal part and the current to be measured flowing through it, b) a structurally integrated measuring circuit, the measuring circuit measuring the electrical voltage which drops across the resistor element, c) a plurality of pairs of voltage taps for measuring the electric voltage falling across the resistor element, the pairs of voltage taps being connected to the measuring circuit, d) a first busbar connection made of a conductive material for electrical and mechanical connection to a first busbar, the first busbar connection being electrically connected to the first connecting part of the current sense resistor, and e) a second busbar connection made of a conductor material for electrical and mechanical connection to a second busbar, the second busbar connection being electrically connected to the second connecting part of the current sense resistor, wherein f) the resistor element of the current sense resistor has a specific thermoelectric force which generates a specific thermoelectric voltage in the event of a temperature difference between the resistor element on the one hand and the connecting parts on the other hand, and g) a compensating element is provided for compensating the thermoelectric voltage which drops across the resistor element, h) the compensating element is thermally connected to the two connecting parts and is thus exposed to the same temperature differences as the resistor element, i) the compensating element generates a specific thermoelectric voltage in the event of a temperature difference between the compensating element on the one hand and the connecting parts on the other hand, and j) the compensating element and the resistor element are electrically connected in series in a measuring circuit for voltage measuring and are connected to the measuring circuit so that the thermoelectric voltages of the resistor element on the one hand and of the compensating element on the other hand at least partially compensate each other.

39. Measuring arrangement for measuring an electric current in a high-current range, comprising:

a) a low-resistance current sense resistor for current measurement in accordance with the four-wire technology, with
  a1) a first connecting part made of a conductor material for introducing the electric current to be measured into the current sense resistor,
  a2) a second connecting part made of a conductor material for conducting the electric current to be measured out of the current-measuring resistor, and
  a3) a resistor element made of a resistance material, the resistor element being electrically connected between the first terminal part and the second terminal part and the current to be measured flowing through it, b) a structurally integrated measuring circuit, the measuring circuit measuring the electrical voltage which drops across the resistor element, c) a plurality of pairs of voltage taps for measuring the electric voltage falling across the resistor element, the pairs of voltage taps being connected to the measuring circuit, d) a first busbar connection made of a conductive material for electrical and mechanical connection to a first busbar, the first busbar connection being electrically connected to the first connecting part of the current sense resistor, and e) a second busbar connection made of a conductor material for electrical and mechanical connection to a second busbar, the second busbar connection being electrically connected to the second connecting part of the current sense resistor, wherein f) for measuring the temperature difference across the resistor element, a thermocouple is provided for the purpose of computationally compensating the thermoelectric voltage which arises over the resistor element, and g) the measuring circuit is connected to the thermocouple.

40. Measuring arrangement for measuring an electric current in a high-current range, comprising:

a) a low-resistance current sense resistor for current measurement in accordance with the four-wire technology, with
  a1) a first connecting part made of a conductor material for introducing the electric current to be measured into the current sense resistor,
  a2) a second connecting pal made of a conductor material for conducting the electric current to be measured out of the current-measuring resistor, and
  a3) a resistor element made of a resistance material, the resistor element being electrically connected between the first terminal part and the second terminal part and the current to be measured flowing through it, b) a structurally integrated measuring circuit, the measuring circuit measuring the electrical voltage which drops across the resistor element, c) a plurality of pairs of voltage taps for measuring the electric voltage falling across the resistor element, the pairs of voltage taps being connected to the measuring circuit, d) a first busbar connection made of a conductive material for electrical and mechanical connection to a first busbar, the first busbar connection being electrically connected to the first connecting part of the current sense resistor, and e) a second busbar connection made of a conductor material for electrical and mechanical connection to a second busbar, the second busbar connection being electrically connected to the second connecting part of the current sense resistor, wherein the measuring arrangement has a high-voltage transformer for supplying power to the measuring circuit.

41. Measuring arrangement for measuring an electric current in a high-current range, comprising:

a) a low-resistance current sense resistor for current measurement in accordance with the four-wire technology, with a1) a first connecting part made of a conductor material for introducing the electric current to be measured into the current sense resistor, a2) a second connecting pail made of a conductor material for conducting the electric current to be measured out of the current-measuring resistor, and a3) a resistor element made of a resistance material, the resistor element being electrically connected between the first terminal part and the second terminal part and the current to be measured flowing through it, b) a structurally integrated measuring circuit, the measuring circuit measuring the electrical voltage which drops across the resistor element, c) a plurality of pairs of voltage taps for measuring the electric voltage falling across the resistor element, the pairs of voltage taps being connected to the measuring circuit, d) a first busbar connection made of a conductive material for electrical and mechanical connection to a first busbar, the first busbar connection being electrically connected to the first connecting part of the current sense resistor, and e) a second busbar connection made of a conductor material for electrical and mechanical connection to a second busbar, the second busbar connection being electrically connected to the second connecting part of the current sense resistor, wherein the measuring arrangement for supplying power to the measuring circuit has a photovoltaic cell which is irradiated by a light source for generating current via a light guide.

42. Measuring arrangement for measuring an electric current in a high-current range, comprising:

a) a low-resistance current sense resistor for current measurement in accordance with the four-wire technology, with a1) a first connecting part made of a conductor material for introducing the electric current to be measured into the current sense resistor, a2) a second connecting part made of a conductor material for conducting the electric current to be measured out of the current-measuring resistor, and a3) a resistor element made of a resistance material, the resistor element being electrically connected between the first terminal part and the second terminal part and the current to be measured flowing through it, b) a structurally integrated measuring circuit, the measuring circuit measuring the electrical voltage which drops across the resistor element, c) a plurality of pairs of voltage taps for measuring the electric voltage falling across the resistor element, the pairs of voltage taps being connected to the measuring circuit, d) a first busbar connection made of a conductive material for electrical and mechanical connection to a first busbar, the first busbar connection being electrically connected to the first connecting part of the current sense resistor, and e) a second busbar connection made of a conductor material for electrical and mechanical connection to a second busbar, the second busbar connection being electrically connected to the second connecting part of the current sense resistor, wherein the measuring circuit has a first measuring channel with a first sampling rate for continuous current detection and a separate second measuring channel with a higher second sampling rate for overcurrent detection.

\* \* \* \* \*